(12) United States Patent
Sugano et al.

(10) Patent No.: US 7,440,289 B2
(45) Date of Patent: Oct. 21, 2008

(54) MEMORY MODULE

(75) Inventors: Toshio Sugano, Tokyo (JP); Shunichi Saito, Tokyo (JP); Atsushi Hiraishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 0 days.

(21) Appl. No.: 11/987,080

(22) Filed: Nov. 27, 2007

(65) Prior Publication Data

US 2008/0123303 A1 May 29, 2008

(30) Foreign Application Priority Data

Nov. 29, 2006 (JP) .............................. 2006-321217

(51) Int. Cl.
*H05K 7/00* (2006.01)
(52) U.S. Cl. ........................ 361/760; 361/764; 361/765; 361/749
(58) Field of Classification Search ................. 361/760, 361/749, 764–765, 775
See application file for complete search history.

(56) References Cited

U.S. PATENT DOCUMENTS

| | | | | |
|---|---|---|---|---|
| 5,982,654 A * | 11/1999 | Corisis | ........................ | 365/63 |
| 6,243,272 B1 * | 6/2001 | Zeng et al. | ................... | 361/760 |
| 6,982,893 B2 * | 1/2006 | Jakobs | .......................... | 365/63 |
| 7,102,221 B2 * | 9/2006 | Miyamoto et al. | .......... | 257/690 |
| 7,269,025 B2 * | 9/2007 | David | .......................... | 361/760 |
| 2008/0094811 A1 * | 4/2008 | Hazelzet | ..................... | 361/760 |
| 2008/0123303 A1 * | 5/2008 | Sugano et al. | .............. | 361/728 |

FOREIGN PATENT DOCUMENTS

JP 2006-268683 10/2006

* cited by examiner

*Primary Examiner*—Dean A. Reichard
*Assistant Examiner*—Andargie M Aychillhum
(74) *Attorney, Agent, or Firm*—McGinn IP Law Group, PLLC

(57) ABSTRACT

A memory module includes a memory chip MC1 disposed at a position opposite to a memory buffer via a module substrate, a memory chip MC3 disposed at a position not opposite to the memory buffer via the module substrate, and a memory chip MC11 disposed at a position opposite to the memory chip MC3 via the module substrate. A branch point at which a wiring part connected to the memory chip MC1 and a wiring part connected to the memory chips MC3 and MC11 are branched is positioned at the memory buffer side from the viewpoint of the intermediate point between the planar mounting position of the memory buffer and the planar mounting position of the memory chips MC3 and MC11. Accordingly, the wiring length of the wiring part can be made sufficiently short.

15 Claims, 10 Drawing Sheets

MEMORY MODULE

TECHNICAL FIELD

The present invention relates to a memory module, and, more particularly to a memory module having a control chip such as a memory buffer and plural memory chips mounted on a module substrate, such as a DIMM (Dual Inline Memory Module)

BACKGROUND OF THE INVENTION

A DRAM (Dynamic Random Access Memory) is mainly used as a main memory in a personal computer or a server. It is common that the DRAM used for a main memory is mounted in advance on a memory module such as a DIMM, to facilitate operations of expansion.

A memory module of a type called an Unbuffered memory module is widely used. However, the Unbuffered memory module employs a stab system for connecting all memory modules to the same channel. Therefore, when the number of memory modules is increased, the load on the channel increases accordingly. When the number of memory modules is increased, the number of branch points on the transmission line increases, and the signal quality is lowered.

Therefore, when a high data transfer rate is required, a memory module of a type called a Fully Buffered memory module is used (Japanese Patent Application Laid-open No. 2006-268683). According to the Fully Buffered memory module, plural memory modules are connected in cascade. Therefore, the Fully Buffered memory module has an advantage in that the load applied to the channel does not increase even when the number of used memory modules increases. Because no branch point is generated on the transmission line, high signal quality can be secured.

In the Fully Buffered memory module, a memory buffer called an AMB (Advanced Memory Buffer) is mounted on the module substrate, in addition to plural memory chips. The memory buffer buffers an address, data, and a command supplied from the memory controller, and transfers them to memory chips on the memory module.

As explained above, in the Fully Buffered memory module, the memory buffer and plural memory chips are mounted on the module substrate. Because it is desired to mount as many memory chips as possible on the module substrate, memory chips are often mounted on a position opposite to the memory buffer, that is, on the back surface of the memory buffer, via the module substrate.

FIG. 6 is a schematic diagram for explaining a general wiring method in a memory module having memory chips mounted on the back surface of the memory buffer. In FIG. 6, memory chips MC1 and MC2 are those mounted on the back surface of a memory buffer MB. On the other hand, memory chips MC3 to MC18 are those mounted at positions on different planes from that of the memory buffer MB.

According to the wiring method shown in FIG. 6, the output signal from the memory buffer MB is first supplied to a branch point B0 via a wiring part A0, and this output signal is distributed to wiring parts A10 and A20. The output signal on the wiring part A10 is distributed to wiring parts A11 and A12 at a branch point B1. Similarly, the output signal on the wiring part A20 is distributed to wiring parts A21 and A22 at a branch point B2.

As shown in FIG. 6, the wiring part A11 is that for supplying a signal to a memory chip MC1, and a wiring part A12 is that for supplying a signal to memory chips MC3, MC5, MC7, MC9, MC11, MC13, MC15, and MC17. The wiring part A21 is that for supplying a signal to a memory chip MC2, and a wiring part A22 is that for supplying a signal to memory chips MC4, MC6, MC8, MC10, MC12, MC14, MC16, and MC18.

The wiring parts A11 and A21 are wirings exclusive for the memory chips MC1 and MC2, and therefore, have small load and short wiring lengths, respectively. Consequently, there is a problem in that the output signal from the memory buffer MB is reflected from terminals of the memory chips MC1 and MC2 connected to the wiring parts A11 and A21, and a signal waveform is distorted.

FIG. 7 is a schematic graph showing a voltage change appearing in the wiring part A12 when a step pulse is output from the memory buffer MB.

As shown in FIG. 7, when a step pulse is output from the memory buffer MB, the voltage of the wiring part A12 once increases to V1, maintains V1 during a period t1, and then increases to V2. In other words, the waveform becomes step-like. This waveform is formed because the step pulse reaching the wiring part A12 includes a component that directly reaches the wiring part A12 via the wiring parts A0 and A10, and a component that is reflected from the terminal of the memory chip MC1 connected to the wiring part A11. Consequently, when the length of the wiring part A11 is longer, the period t1 during which the voltage is kept at V1 becomes longer, and the waveform is distorted large.

Accordingly, when the memory buffer MB outputs a complementary signal, a cross-point becomes unclear, as shown in FIG. 8. As a result, in the memory module of the type using both edges of the clock like the DDR DRAM, a high-speed data transmission becomes difficult.

To suppress the reflection of a signal from the memory chips MC1 and MC2, there is a method of connecting terminating resistors R1 and R2 to the wiring parts A11 and A12, as shown in FIG. 9. However, the terminating resistor takes a very large area on the module substrate, and therefore, it is not realistic to add the terminating resistor to a part near the memory buffer MB (the center of the module substrate) Further, the wiring parts A11 and A12 are relatively near the memory buffer MB. Therefore, when the terminating buffers R1 and R2 are connected to this part, the output power of the memory buffer MB needs to be increased. When the output power of the memory buffer MB is increased, the reflections of the signal from the memory chips MC1 and MC2 increase. Consequently, it becomes difficult to sufficiently suppress the reflections of the signal.

Furthermore, as shown in FIG. 10, there is also a method that the front surface and the back surface of the module substrate are separately connected, instead of using wirings branched to the memory chips MC1 and MC2. That is, the wiring branched to the memory chips MC1 and MC2 is not necessary, when the memory chips MC3 to MC10 mounted on the front surface of the module substrate are connected in cascade using wiring parts A31 and A32, and when the memory chips MC1, MC2, and MC11 to MC18 mounted on the back surface of the module substrate are connected in cascade using wiring parts A41 and A42.

However, when this connection is carried out, there arises a difference between the wiring lengths from the memory buffer MB to a pair of memory chips, that is, two opposite memory chips (the memory chips MC3 and MC11, for example) that sandwich the module substrate. Therefore, it becomes considerably complex to adjust a delay in the memory buffer MB and the number of wirings also increases. Therefore, this method is not practical.

SUMMARY OF THE INVENTION

As explained above, the conventional memory module has various problems regarding the wiring of the memory chips when the memory chips are mounted on the back surface of the memory buffer. The present invention has been achieved to solve the above problems, and an object of the present invention is to provide an improved memory module having memory chips mounted on the back surface of a control chip of a memory buffer or the like.

Another object of the present invention is to decrease the influence of a reflection of a signal from a terminal of a memory chip mounted on the back surface of a control chip.

A memory module according to one aspect of the present invention comprising a module substrate, a control chip and a plurality of memory chips mounted on the module substrate, and a wiring pattern connecting in common the control chip to the plurality of memory chips, wherein among the plurality of memory chips, a first memory chip is disposed at a position opposite to the control chip via the module substrate, a second memory chip is disposed at a position not opposite to the control chip on via the module substrate, and a third memory chip is disposed at a position opposite to the second memory chip via the module substrate, and among the wiring patterns, a first branch point at which a first wiring part connected to the first memory chip and a second wiring part connected to the second and the third memory chips are branched is positioned at the control chip side from the viewpoint of the intermediate point between the planar mounting position of the control chip and the planar mounting position of the second and the third memory chips.

According to the present invention, the first branch point is positioned at the control chip side. Therefore, the wiring length of the first wiring part can be made sufficiently short. Consequently, the period t1 shown in FIG. 7 can be substantially shortened, and the cross-point of the complementary signal can be made clear. Accordingly, the present invention can be remarkably suitable to the memory module that can perform a high-speed data transmission.

BRIEF DESCRIPTION OF THE DRAWINGS

The above and other objects, features and advantages of this invention will become more apparent by reference to the following detailed description of the invention taken in conjunction with the accompanying drawings, wherein:

FIG. 1A is a top plan view of one surface of the memory module, and FIG. 1B is a top plan view of the other surface of the memory module;

DETAILED DESCRIPTION OF THE EMBODIMENTS

Preferred embodiments of the present invention will be explained below with reference to the accompanying drawings.

Figure 1A:
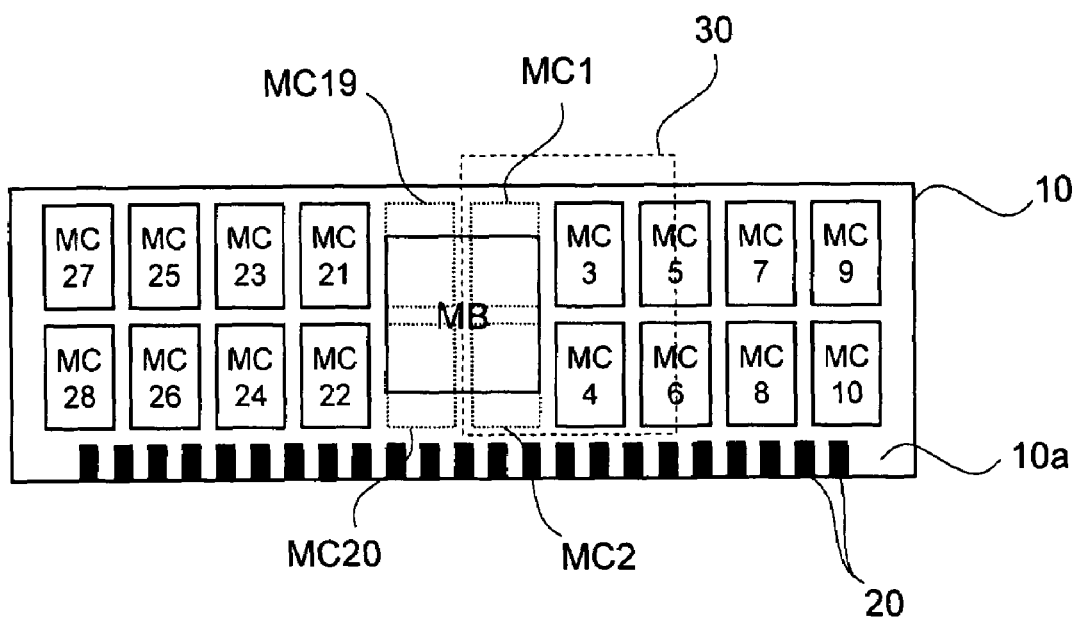
FIGS. 1A and 1B are schematic diagrams of a configuration of a memory module according to a preferred embodiment of the present invention.
Figure 1B:
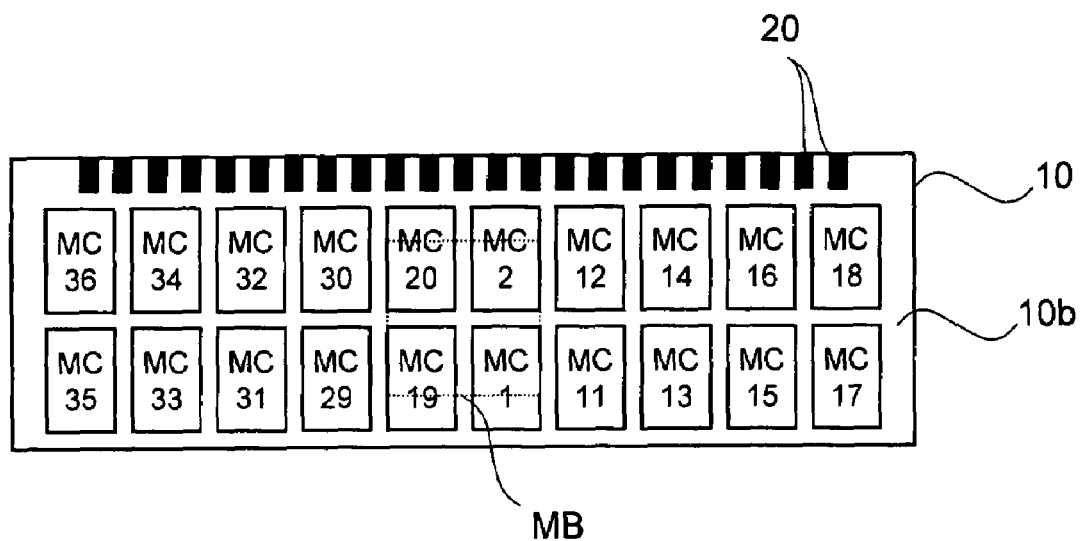

FIGS. 1A and 1B are schematic diagrams of a configuration of a memory module according to a preferred embodiment of the present invention. FIG. 1A is a top plan view of one surface of the memory module, and FIG. 1B is a top plan view of the other surface of the memory module.

As shown in FIGS. 1A and 1B, the memory module according to the present embodiment has a memory buffer MB and memory chips MC1 to MC36 mounted on a module substrate 10. The memory buffer MB is disposed at approximately the center of one surface 10a of the module substrate 10, and eight memory chips are disposed at each of both sides of the memory buffer MB. Therefore, 16 memory chips are disposed in total on the one surface 10a of the module substrate 10. Further, 20 memory chips are mounted on the other surface 10b of the module substrate 10. Accordingly, 36 memory chips are mounted in total on the module substrate 10.

As shown in FIGS. 1A and 1B, terminal electrodes 20 are provided in one row at one edge of the module substrate 10. In actually using the memory module, these terminal electrodes 20 are inserted into memory slots to connect the terminal electrodes 20 to a mother board. The terminal electrodes 20 are connected to the memory buffer MB via a wiring pattern (not shown).

Among the 36 memory chips mounted on the module substrate 10, four memory chips MC1, MC2, MC19, and MC20 are disposed at positions opposite to the memory buffer MB, on the module substrate. The other memory chips are disposed at positions not opposite to the memory buffer MB, on the module substrate, and two memory chips opposite to each other by sandwiching the module substrate 10 form a pair of memory chips. The 36 memory chips are disposed symmetrically, with the memory chips MC1 to MC18 disposed at the right half side in FIG. 1A, and the memory chips MC19 to MC36 disposed at the left half side in FIG. 1A.

Figure 2:
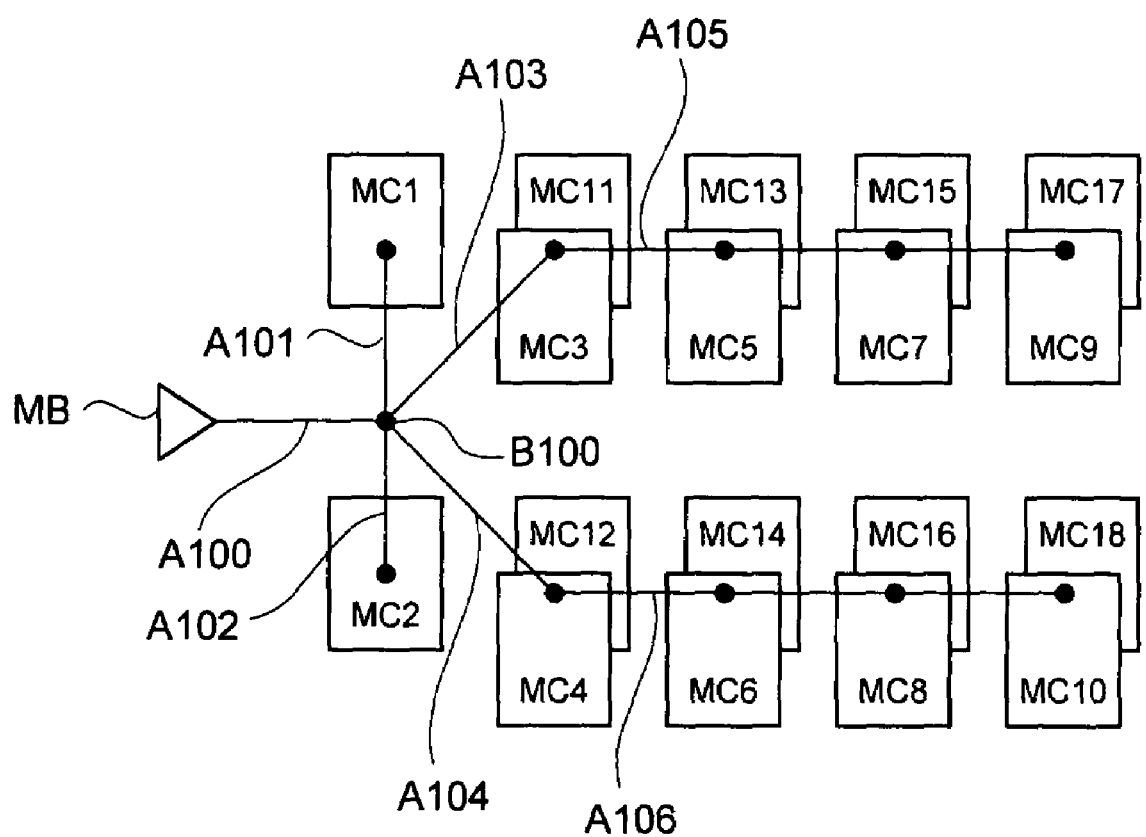
FIG. 2 is a schematic view for explaining the wiring pattern of the memory module according to the present embodiment.

FIG. 2 is a schematic view for explaining the wiring pattern of the memory module according to the present embodiment. The wiring pattern formed on the module substrate 10 obviously includes many internal wirings and through-hole electrodes that connect between the internal wirings. FIG. 2 shows a representative wiring pattern that connects in common the memory buffer MB to the memory chips MC1 to MC36. The wiring pattern having the common connection includes address wirings and command wirings. While FIG. 2 shows only the memory chips MC1 to MC18 disposed on the right half side shown in FIGS. 1A and 1B, the memory chips MC19 to MC36 disposed on the left half side in FIGS. 1A and 1B also have a similar arrangement.

As shown in FIG. 2, according to the memory module of the present embodiment, the output signal from the memory buffer MB is first supplied to a branch point B100 via a wiring part A100, and the output signal is distributed to wiring parts A101 to A104 at this branch point B100. The wiring part A101 is that for supplying the signal to the memory chip MC1, and the wiring part A102 is that for supplying the signal to the memory chip MC2. The wiring part A103 is that for supplying the signal to the memory chips MC3 and MC11, and the signal is supplied to the memory chips MC5, MC7, MC9, MC13, MC15, and MC17 disposed at the latter stage of the wiring part A103. Similarly, the wiring part A104 is that for supplying the signal to the memory chips MC4 and MC12, and the signal is supplied to the memory chips MC6, MC8, MC10, MC14, MC16, and MC18 disposed at the latter stage of the wiring part A104, via the wiring part A106.

Figure 3:
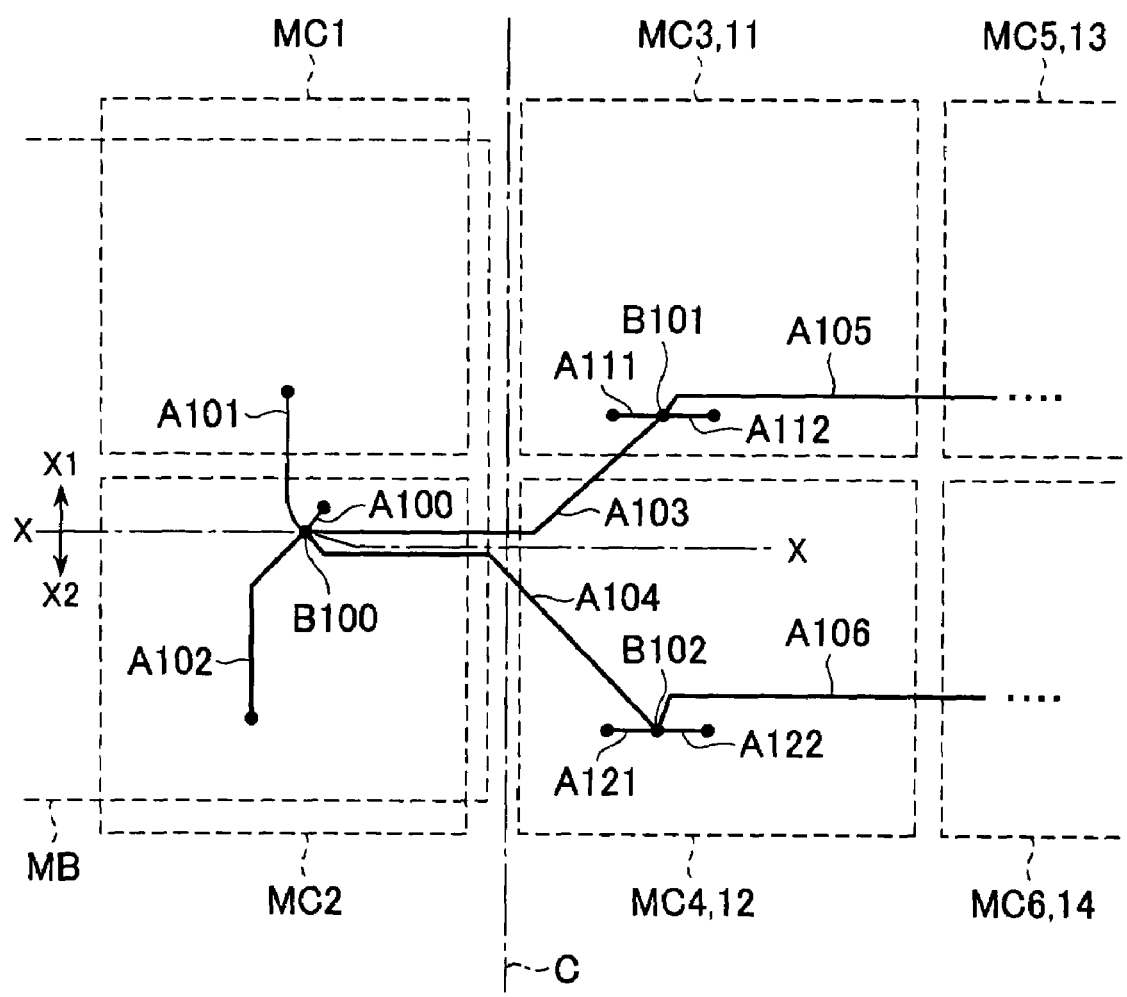
FIG. 3 is an explanatory diagram of the layout of the wiring pattern formed in an area 30 shown in FIG. 1A.
Figure 4:
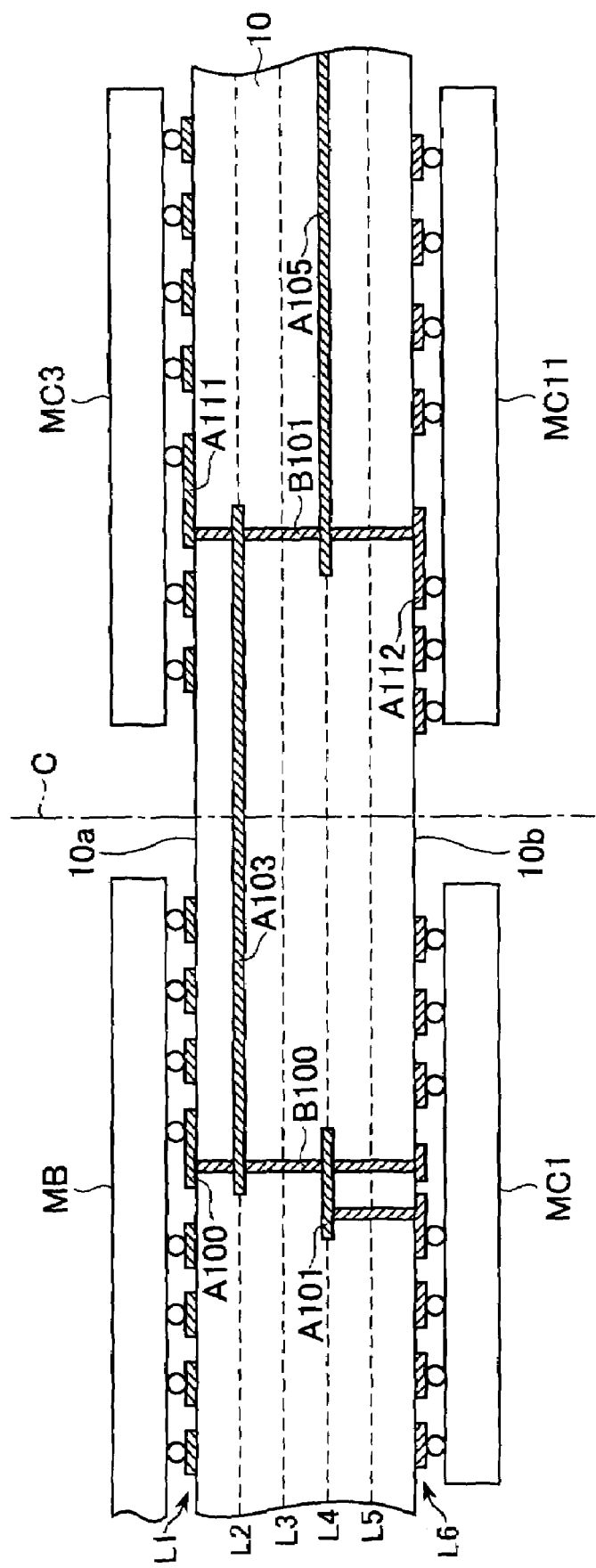
FIG. 4 is a perspective cross-sectional view of a cross section along a line X-X shown in FIG. 3 observed in the direction of X1.

FIG. 3 is an explanatory diagram of the layout of the wiring pattern formed in an area 30 shown in FIG. 1A. FIG. 4 is a perspective cross-sectional view of a cross section along a line X-X shown in FIG. 3 observed in the direction of X1, and FIG. 5 is a perspective cross-sectional view of the cross section along the line X-X observed in the direction of X2.

Figure 5:
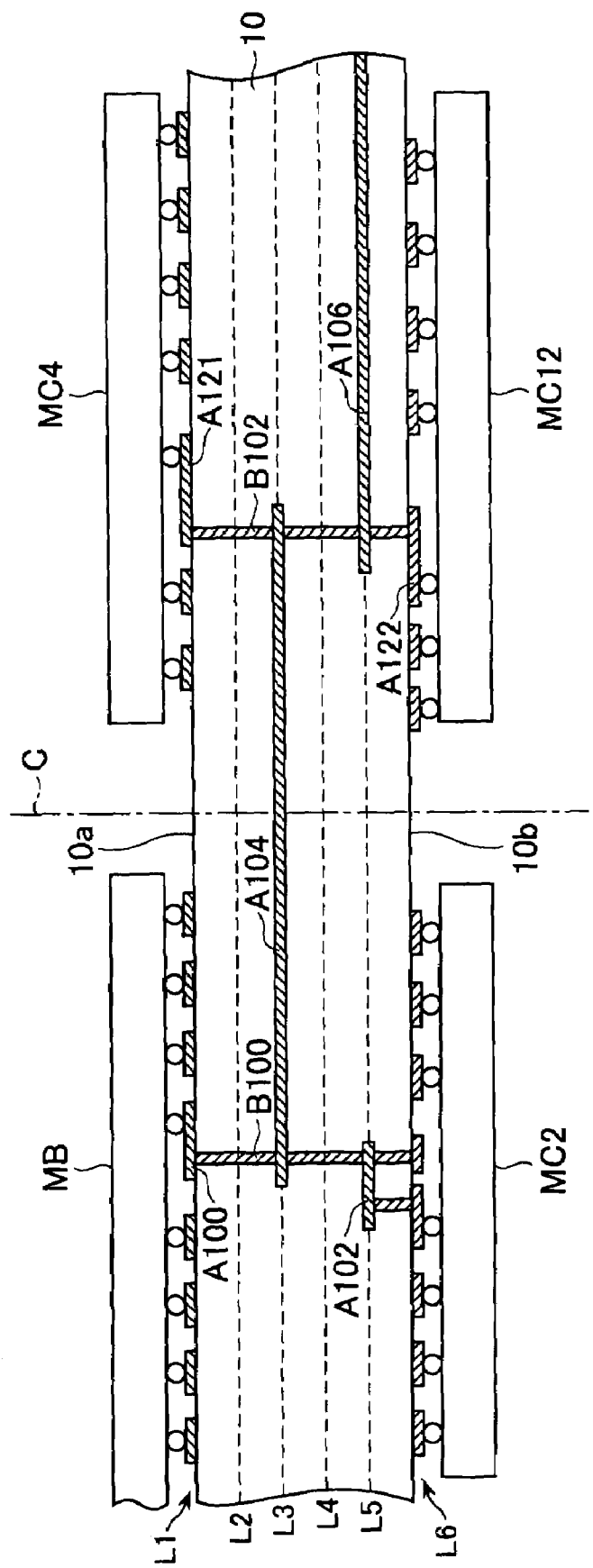
FIG. 5 is a perspective cross-sectional view of the cross section along the line X-X observed in the direction of X2.
Figure 6:
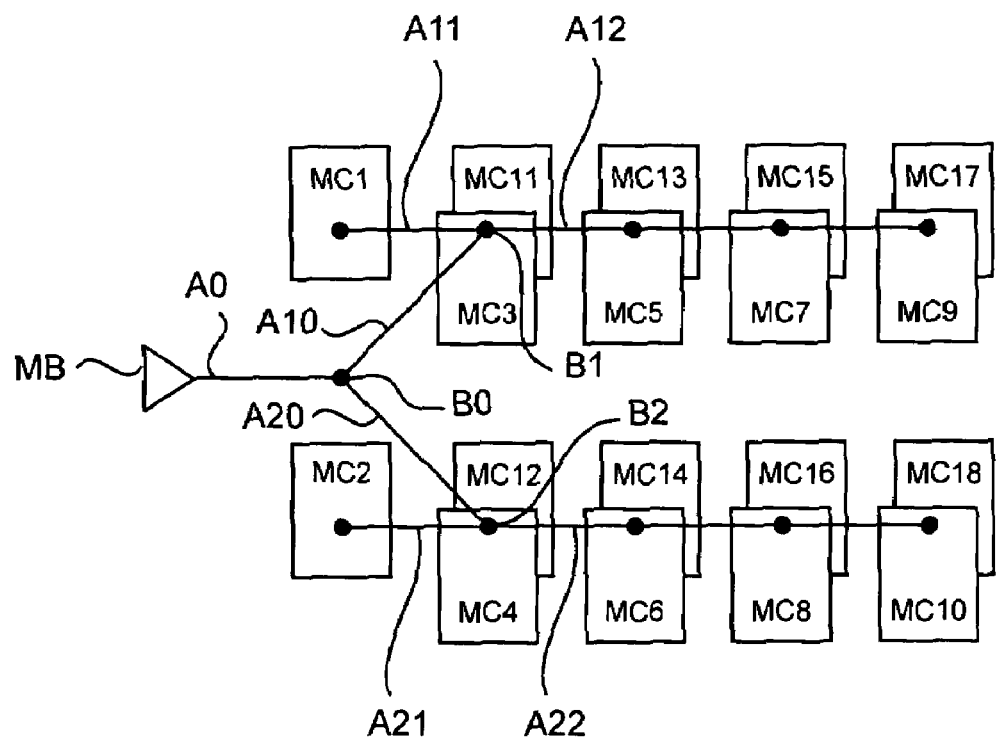
FIG. 6 is a schematic diagram for explaining a general wiring method in a memory module.
Figure 7:
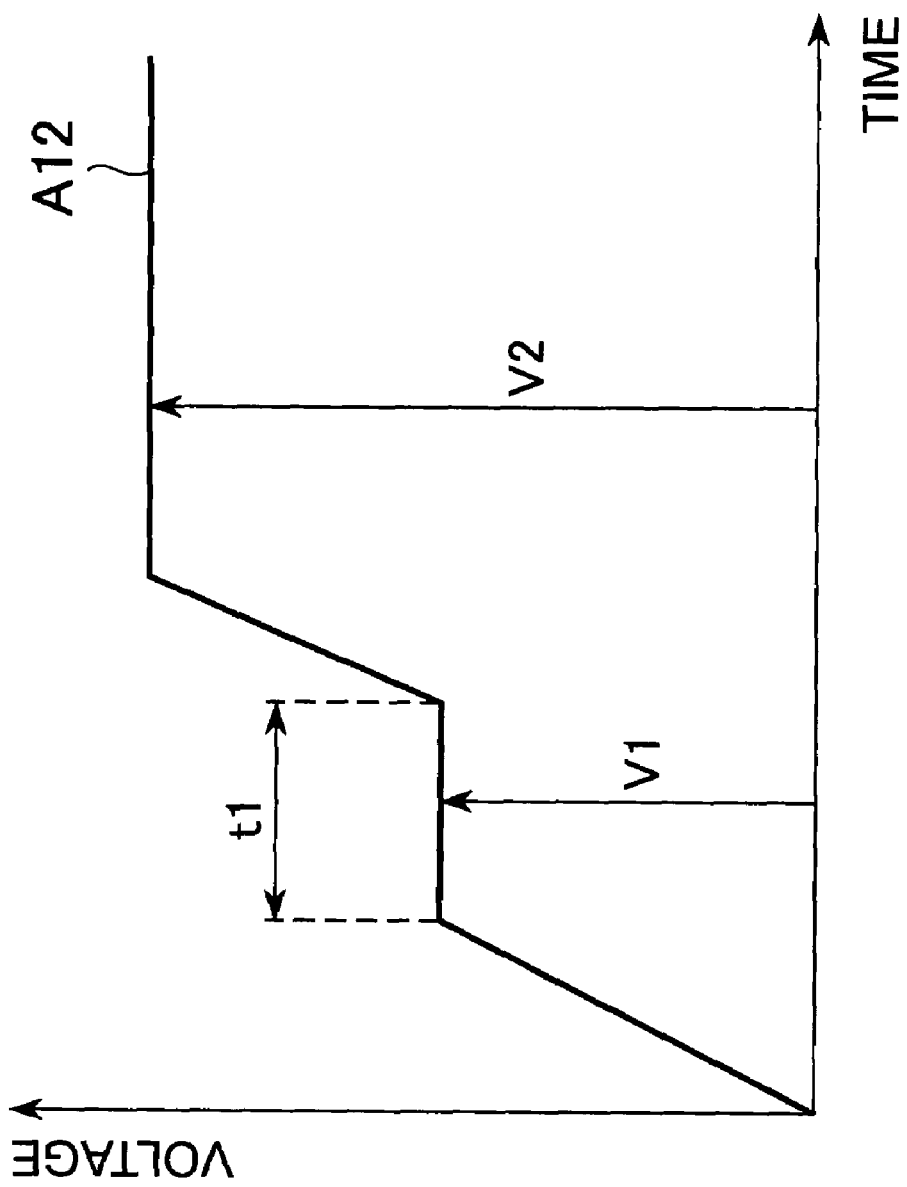
FIG. 7 is a schematic graph showing a voltage change appearing in the wiring part A12 when a step pulse is output from the memory buffer MB.
Figure 8:
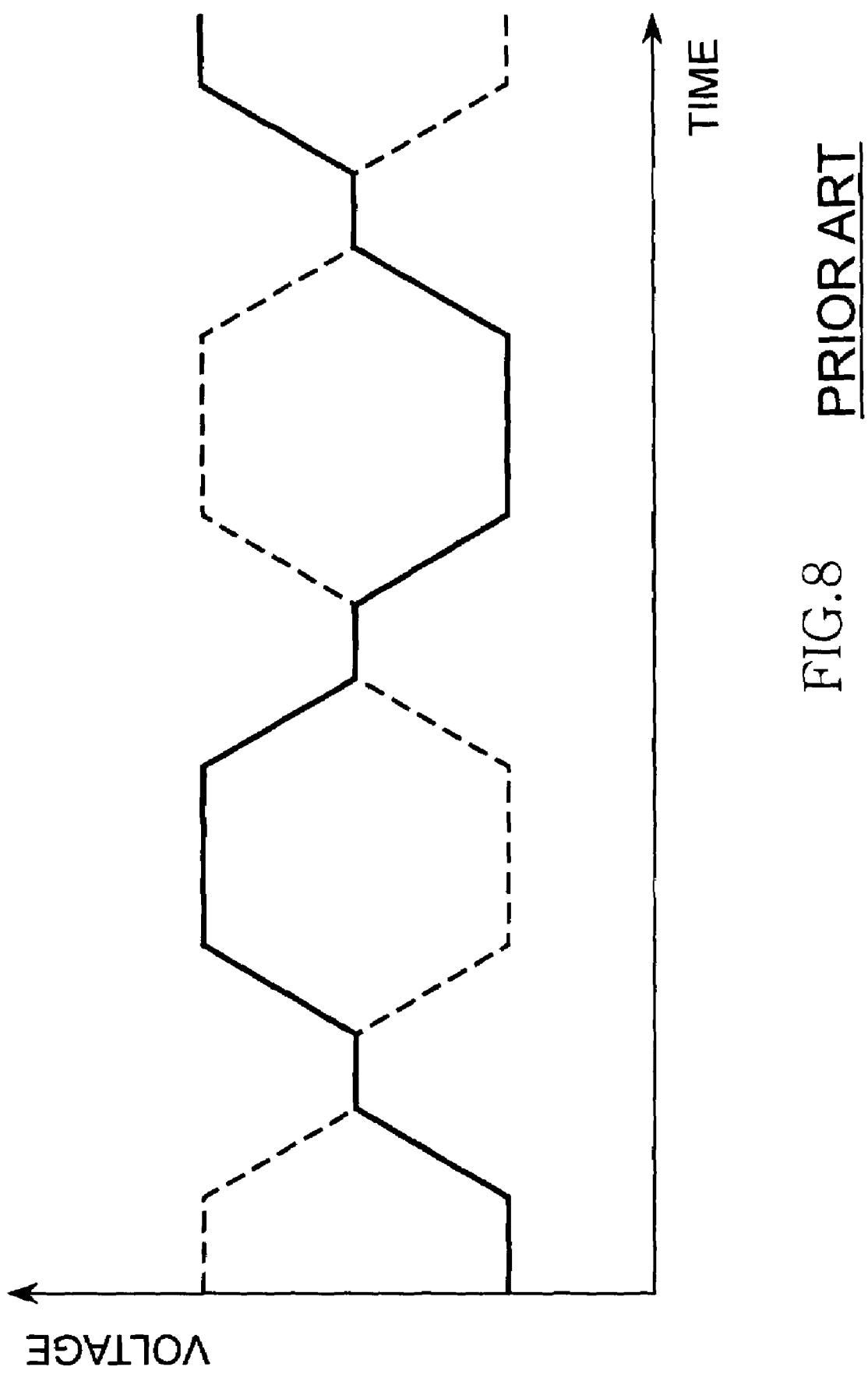
FIG. 8 is a schematic waveform diagram when the memory buffer MB outputs a complementary signal.
Figure 9:
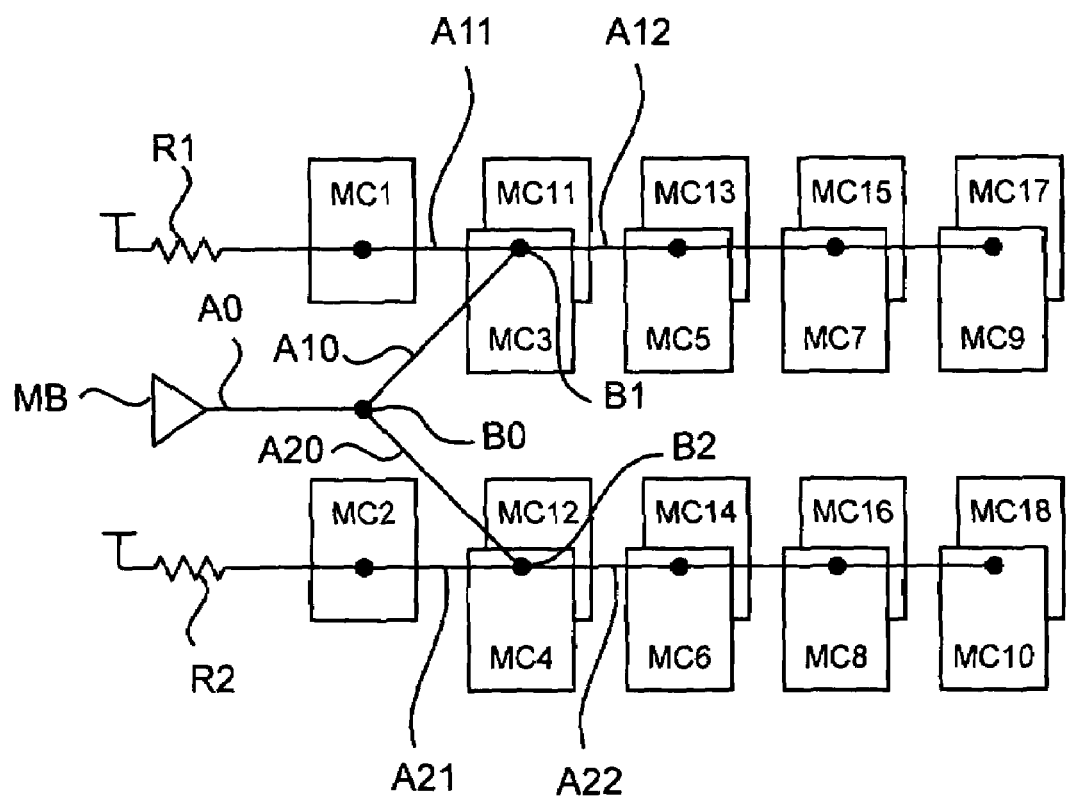
FIG. 9 is a schematic diagram for explaining a modified wiring method in a memory module.
Figure 10:
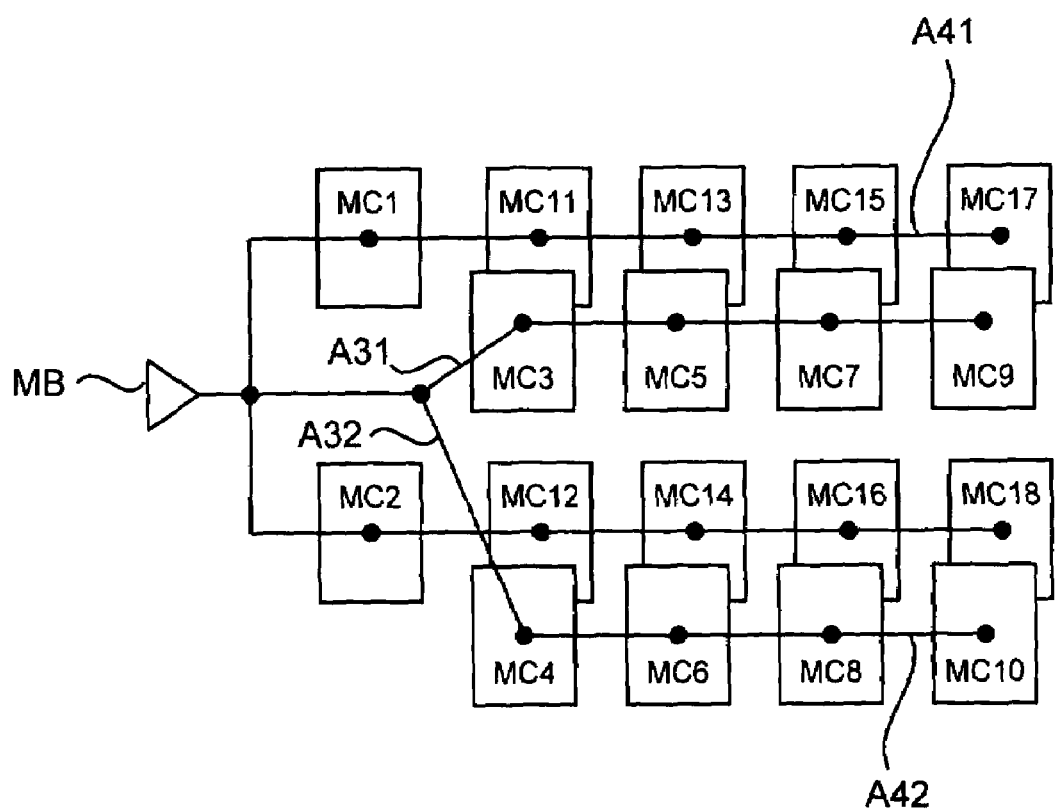
FIG. 10 is a schematic diagram for explaining another modified wiring method in a memory module.

As shown in FIG. 4 and FIG. 5, the module substrate 10 has six wiring layers L1 to L6, and the wiring part A100 is formed in a wiring layer L1. The wiring part A100 is connected to a branch point B100 constituted by a through-hole electrode, and is distributed to the wiring parts A101 to A104 at this branch point B100. These wiring parts A101 to A104 are formed in the mutually different wiring layers L4, L5, L2, and L3.

This branch point B100 is disposed in the area covered by the memory buffer MB, as shown in FIG. 3 to FIG. 5. Because the memory chips MC1 and MC2 are disposed on the back surface of the memory buffer MB as described above, the lengths of the wiring parts A101 and A102 as the wirings exclusive for the memory chips MC1 and MC2 are very short. Specifically, the lengths of the wiring parts A101 and A102 can be made substantially shorter than the lengths of the wiring parts A103 and A104. Accordingly, the influence of the reflection of the signal from the terminals of the memory chips MC1 and MC2 via the wiring parts A101 and A102 can be made sufficiently short. Because the branch points of the wiring parts A101 to A104 are also present in the same through-hole electrode, the wiring pattern can be simplified.

As described above, the memory module has many wiring patterns each of which connects in common the memory buffer MB to the memory chips MC1 to MC36. It is desirable that the branch point B100 is disposed in the area covered with the memory buffer MB, for all of these wiring patterns. However, because of the layout constraint, it is often difficult to dispose the branch point B100 at the above position in all cases. In this case, when it is difficult to dispose the branch point B100 in the area covered with the memory buffer MB, the branch point B100 can be disposed at least at the memory buffer MB side from the viewpoint of an intermediate line C between the planar mounting position of the memory buffer MB and the planar mounting position of the adjacent memory chips (for example, MC3 and MC11).

The output signal distributed to the wiring part A103 is supplied to a branch point B101 constituted by a through-electrode, and is distributed to wiring parts A111, A112, and A105 from the branch point B101. The wiring parts A111, A112, and A105 are also formed on mutually different wiring layers L1, L6, and L4. The wiring parts A111 and A112 are those for supplying the signal to the opposite memory chips MC3 and MC11 on the module substrate 10.

Similarly, the output signal distributed to the wiring part A104 is supplied to a branch point B102, and is distributed to wiring parts A121, A122, and A106. The wiring parts A121, A122, and A106 are also formed on the mutually different wiring layers L1, L6, and L5. The wiring parts A121 and A122 are those for supplying the signal to the opposite memory chips MC4 and MC12 on the module substrate 10.

As explained above, according to the memory module of the present embodiment, the branch point B100 is positioned in the area covered with the memory buffer MB. Therefore, the influence of the reflection of the signal from the terminals of the memory chips MC1 and MC2 via the wiring parts A101 and A102 can be made sufficiently small. Further, because the wiring part A100 is branched to the four wiring parts A101 to A104 using the same through-hole electrode, the wiring pattern can be also simplified.

While a preferred embodiment of the present invention has been described hereinbefore, the present invention is not limited to the aforementioned embodiment and various modifications can be made without departing from the spirit of the present invention. It goes without saying that such modifications are included in the scope of the present invention.

For example, the number of memory chips MC disposed at positions opposite to the memory buffer MB on the module substrate 10 is not limited to four as explained in the above embodiment, and the number can be less than or more than four. Similarly, the number of memory chips MC disposed at positions not opposite to the position of the memory buffer MB on the module substrate 10 is not particularly limited.

While the memory chips MC are mounted in two rows on both surfaces respectively of the module substrate 10 in the embodiment, the manner of mounting the memory chips MC is not limited thereto. Accordingly, the memory chips MC can be mounted in one row on both surfaces respectively of the module substrate 10, or the memory chips MC can be mounted on only one surface of the module substrate 10.

The chip disposed at the center of the module substrate 10 is not limited to the memory buffer MB, and the present invention can be applied to any kind of control chip having the interface function.

What is claimed is:

1. A memory module, comprising:
   a module substrate having internal wirings and a plurality of through-hole electrodes for connecting between the internal wirings; and
   a control chip and a plurality of memory chips mounted on the module substrate, wherein
   the control chip is connected in common to the plurality of memory chips via the internal wirings and the through-hole electrodes,
   the plurality of memory chips include at least first to third memory chips, the first memory chip is disposed on a reverse side of the module substrate with respect to the control chip, the second chip is disposed at adjacent to the first memory chip, and the third memory chip is disposed on a reverse side of the module substrate with respect to the second memory chip,
   the internal wirings includes at least first and second wiring parts, the first wiring part is connected to the first memory chip, the second wiring part is connected to the second and the third memory chips, the first and second wiring parts are branched at a predetermined through-hole electrode,
   the predetermined through-hole electrode is positioned at the control chip side from a viewpoint of an intermediate line between a planar mounting position of the control chip and a planar mounting position of the second and third memory chips.

2. The memory module as claimed in claim 1, wherein the first wiring part is shorter than the second wiring part.

3. The memory module as claimed in claim 1, wherein the plurality of memory chips further include a fourth memory chip disposed at adjacent to the first memory chip the reverse side of the module substrate with respect to the control chip, and a fifth memory chip disposed at adjacent to the second memory chip, and the internal wirings further includes third and fourth wiring parts, the third wiring part is connected to the fourth memory chip, the fourth wiring part is connected to the fifth memory chip, the third and fourth wiring parts are branched at said predetermined through-hole electrode.

4. The memory module as claimed in claim 3, wherein the first to the fourth wiring parts are formed on mutually different wiring layers.

5. A memory module; comprising:
a module substrate having a first and a second surfaces;
a control chip mounted on the first surface of the module substrate;
a plurality of memory chips mounted on the first and the second surfaces of the module substrate; and
a wiring pattern connecting in common the control chip to the plurality of memory chips, wherein
the plurality of memory chips include at least first to third memory chips, the first memory chip is disposed at a position opposite to the control chip on the second surface of the module substrate, the second memory chip is disposed on the first surface of the module substrate, and the third memory chip is disposed at a position opposite to the second memory chip on the second surface of the module substrate, and
the wiring patterns include at least first and second wiring parts and a first branch point, the first wiring part is connected to the first memory chip, the second wiring part is connected to the second and the third memory chips, the first and second wiring parts are branched at the first branch point, the first branch point is positioned at the control chip side from a viewpoint of an intermediate line between a planar mounting position of the control chip and a planar mounting position of the second and the third memory chips.

6. The memory module as claimed in claim 5, wherein the first wiring part is shorter than the second wiring part.

7. The memory module as claimed in claim 5, wherein the plurality of memory chips further include a fourth memory chip disposed adjacent to the first memory chip at a position opposite to the control chip on the second surface of the module substrate, and a fifth memory chip disposed adjacent to the second memory chip on the first surface of the module substrate, and the wiring patterns further includes third and fourth wiring parts and a second branch point, the third wiring part is connected to the fourth memory chip, the fourth wiring part is connected to the fifth memory chip, the third and fourth wiring parts are branched at the second branch point, the second branch point is positioned at the control chip side from a viewpoint of an intermediate line between the planar mounting position of the control chip and a planar mounting position of the fifth memory chip.

8. The memory module as claimed in claim 7, wherein the first to the fourth wiring parts are formed on mutually different wiring layers.

9. The memory module as claimed in claim 7, wherein the first branch point and the second branch point are present within the same through-hole electrode provided in the module substrate.

10. The memory module as claimed in claim 9, wherein the through-hole electrode is formed in an area covered with the control chip.

11. A memory module, comprising:
a module substrate;
a control chip and a plurality of memory chips mounted on the module substrate; and
a wiring pattern that connects in common the control chip to the plurality of memory chips, wherein
among the plurality of memory chips, a first and a second memory chips are disposed at positions opposite to the control chip on the module substrate, and a third memory chip is disposed at a position not opposite to the control chip on the module substrate,
the wiring pattern includes a first to a third wiring parts connected to the first to the third memory chips respectively, and
a first branch point at which the first wiring part and the second wiring part are branched and a second branch point at which the first wiring part and the third wiring part are branched are present within the same through-hole electrode provided in the module substrate.

12. The memory module as claimed in claim 11, wherein the first wiring part is shorter than the third wiring part.

13. The memory module as claimed in claim 11, wherein the plurality of memory chips further include a fourth memory chip disposed adjacent to the third memory chip at a position not opposite to the control chip on the module substrate, the wiring pattern further includes a fourth wiring part connected to the fourth memory chip, and
a third branch point at which the third wiring part and the fourth wiring part are branched is present within the through-hole electrode.

14. The memory module as claimed in claim 13, wherein the first to the fourth wiring parts are formed in mutually different wiring layers.

15. The memory module as claimed in claim 13, wherein the plurality of memory chips further include a fifth memory chip disposed at a position opposite to the third memory chip on the module substrate, and a sixth memory chip disposed at a position opposite to the fourth memory chip on the module substrate, and the fifth memory chip is connected to the control chip via the third wiring part, and the sixth memory chip is connected to the control chip via the fourth wiring part.

* * * * *